US006129991A

United States Patent [19]
Warnes et al.

[11] Patent Number: 6,129,991
[45] Date of Patent: Oct. 10, 2000

[54] ALUMINIDE/MCRALY COATING SYSTEM FOR SUPERALLOYS

[75] Inventors: Bruce M. Warnes, Muskegon; William J. Shriver, New Era; Ronald J. Honick, Jr.; Nick S. DuShane, both of Muskegon, all of Mich.

[73] Assignee: Howmet Research Corporation, Whitehall, Mich.

[21] Appl. No.: 08/979,906

[22] Filed: Aug. 14, 1997

Related U.S. Application Data

[63] Continuation-in-part of application No. 08/330,694, Oct. 28, 1994, Pat. No. 5,658,614.

[51] Int. Cl.[7] .............................. B32B 15/00; C23C 16/00
[52] U.S. Cl. ..................... 428/610; 428/615; 428/639; 428/652; 428/668; 428/670; 428/680; 428/941; 416/241 R; 416/241 B; 427/253; 427/456
[58] Field of Search ..................... 428/610, 623, 428/615, 639, 652, 668, 670, 680, 941; 427/456, 253; 205/170; 416/241 R, 241 B; 148/535

[56] References Cited

U.S. PATENT DOCUMENTS

| | | | |
|---|---|---|---|
| 4,080,486 | 3/1978 | Walker et al. | 428/653 |
| 5,658,614 | 8/1997 | Basta et al. | 427/253 |
| 5,716,720 | 2/1998 | Murphy | 428/623 |
| 5,763,107 | 6/1998 | Rickerby et al. | 428/623 |
| 5,788,823 | 8/1998 | Warnes et al. | 205/192 |

FOREIGN PATENT DOCUMENTS

96/34 130  10/1996  WIPO .

OTHER PUBLICATIONS

Evaluation of Simple Aluminide and Platinum Modified Aluminide Coatings on High Pressure Turbine Blades after Factory Engine Testing—Round II International Gas Turbine and Aeroengine Congress and Exposition, Jun. 1–4, 1992, Conner.

Platinum Modified Aluminides—Present Status, Gas Turbine and Aeroengine Congress and Exposition, Jun. 11–14, 1990, Smith et al.

Evaluation of Simple Aluminide and Platinum Modified Aluminide Coatings on High Pressure Turbine Blades after Factory Engine Testing International Gas Turbine and Aeroengine Congress and Exhibition, Jun. 3–6, 1991, Conner et al.

*Primary Examiner*—Timothy M. Speer
*Assistant Examiner*—Bryant Young
*Attorney, Agent, or Firm*—Edward J. Timmer

[57] ABSTRACT

High temperature oxidation resistance of an aluminide diffusion overcoated MCrAlY coating system is substantially improved by CVD over-aluminizing the MCrAlY type overlay coating under CVD conditions that result in reduced concentrations of such tramp impurities as S and P in the aluminized MCrAlY overlay coating region of the coating system. The CVD aluminizing conditions yield an outwardly grown aluminide over-coat on the underlying MCrAlY type coating.

28 Claims, 2 Drawing Sheets

ALUMINIDE/MCRALY COATING SYSTEM FOR SUPERALLOYS

This application is a continuation-in-part of application Ser. No. 08/330,694 filling date Oct. 28, 1994, now U.S. Pat. No. 5,658,614.

FIELD OF THE INVENTION

The present invention relates to an aluminide diffusion overcoated MCrAlY coating system having improved high temperature oxidation resistance and method of making the coating system.

BACKGROUND OF THE INVENTION

U.S. Pat. No. 4,080,486 describes a protective coating system for nickel base and cobalt base superalloy substrates, such as turbine blades and vanes, exposed to high temperature in a gas turbine engine. The patented coating system comprises an MCrAlY type overlay coating, where M is an element selected from the group consisting of iron, nickel and cobalt, that is aluminized by pack cementation to increase the corrosion and oxidation resistance of the coated substrate.

An object of the present invention is to provide a chemical vapor deposition (CVD) aluminide diffusion overcoated MCrAlY coating system having substantially improved high temperature oxidation resistance.

Another object of the present invention is to provide a CVD coating method for making an aluminide diffusion overcoated MCrAlY coating system having substantially improved high temperature oxidation resistance.

A further object of the present invention is to provide a CVD aluminide diffusion overcoated MCrAlY coating system on an exterior of the substrate and a CVD aluminide diffusion coating on an interior of the substrate and method for making same.

SUMMARY OF THE INVENTION

The present invention substantially increases the high temperature oxidation resistance of an aluminide diffusion overcoated MCrAlY coating system by CVD over-aluminizing the MCrALY type coating under CVD conditions that produce an outwardly grown aluminide over-coat on the MCrAlY coating. The diffusion aluminide overcoating formed on the MCrAlY coating exhibits reduced concentrations of such tramp impurities as S and P and others. The CVD aluminizing conditions preferably involve a substrate coating temperature of at least about 1000 degrees C. and a high purity coating gas comprising a mixture of hydrogen and aluminum trichloride gases with such conditions being effective to reduce the concentrations of such tramp impurites as S and P in the aluminized MCrAlY region of the coating system. The aluminide diffusion overcoating preferably has a concentration of sulfur and phosphorous that is about 50% less than the sulfur and phosphorous concentrations of the underlying MCrAlY coating.

One embodiment of the present invention envisions CVD aluminizing an MCrAlY coated substrate without a platinum layer on the MCrAlY overlay coating. Another embodiment of the present invention envisions CVD aluminizing a platinum coated MCrAlY coated substrate without predif-fusion of the platinum to form a platinum modified aluminide diffusion overcoating on the MCrAlY coating.

Still another embodiment of the present invention can be employed to form a CVD aluminide diffusion overcoated MCrAlY coating system on an exterior of a substrate, such as a superalloy turbine blade or vane. A further embodiment of the present invention can be employed to concurrently form a CVD aluminide diffusion coating on interior cooling passages thereof.

The above objects and advantages of the present invention will become more readily apparent when taken with the following detailed description and drawings.

DETAILED DESCRIPTION OF THE INVENTION

An embodiment of the present invention relates to CVD over-aluminizing an MCrAlY type overlay coating under CVD conditions that produce an outwardly grown aluminide over-coat on the MCrAlY coating with the diffusion aluminide overcoating having reduced concentrations of such tramp impurities as S and P that adversely affect oxidation resistance. Other such tramp impurities may include boron and refractory elements such as W, Mo, and Ti. The CVD conditions are controlled to substantially reduce concentrations of such tramp impurities as S and P in the aluminized MCrAlY overlay coating region of the coating system to 20 ppm by weight or less, for example only.

Figure 1:
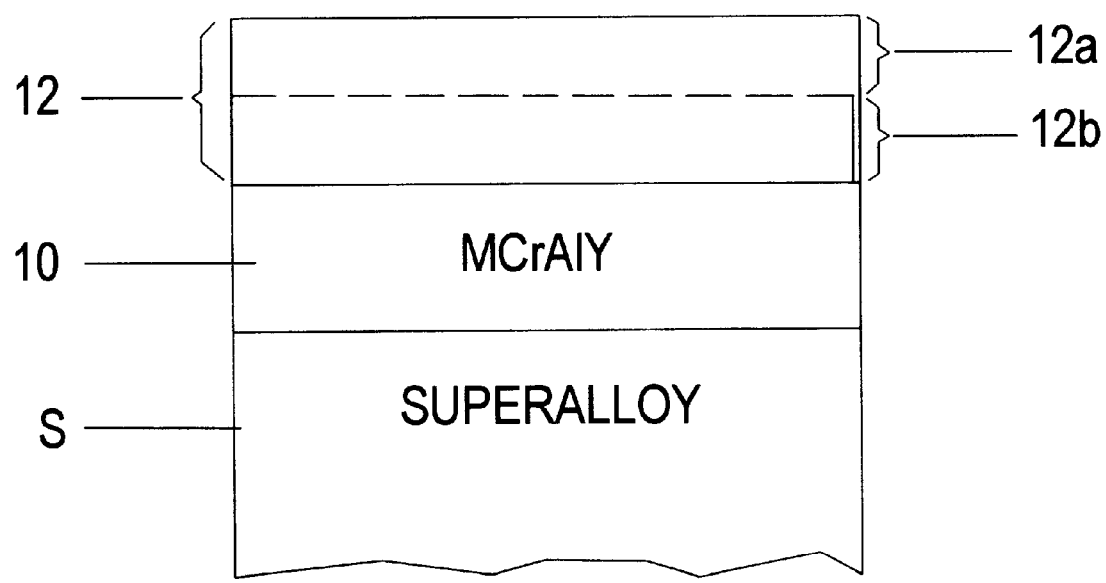
FIG. 1 is a schematic illustration of a coating system of the present invention.

An exemplary coating system in accordance with an embodiment of the invention is illustrated schematically in FIG. 1. The coating system comprises a first coating 10 referred to as an MCrAlY coating and an aluminide diffusion overcoating 12 formed in-situ on the first coating 10 and having an outwardly grown additive layer 12a and diffusion zone 12b proximate the MCrAlY coating 10. The first coating 10 is referred to as an MCrAlY coating for purposes of illustration and not limitation.

Generally, the MCrAlY coating 10 consists essentially of chromium, aluminum, a reactive element selected from the group consisting of yttrium (Y), rare earth elements such as Ce and La and other reactive elements such as Si, Hf, Zr, and element M where M is selected from nickel and/or cobalt and/or iron. The MCrAlY coating 10 typically consists essentially of, in weight %, 14% to 35% Cr, 4% to 30% Al, 0.1% to 3% of Y, rare earth element such as Ce and/or La, and/or other reactive element(s) such as Hf, Zr, Si, and the balance essentially iron and/or nickel and/or cobalt.

Such MCrAlY coating alloys are well known and described in U.S. Pat. No. 4,080,486, the teachings of which are incorporated herein by reference to this end. Although the invention is described below for purposes of illustration, and not limitation, as using a CoNiCrAlY coating 10, the invention can be practiced using any other CoCrAlY, NiCrAlY, CoNiCrAlY, and FeCrAlY coating alloys.

Typically, the MCrAlY first coating is applied to a thickness in the range of 2 mils (0.002 inch) to 20 mils (0.020 inch) as an overlay coating onto a nickel or cobalt based superalloy substrate S, such as gas turbine engine blade or vane. The MCrAlY coating preferably is applied to the substrate by known low pressure plasma spraying or high velocity oxy-fuel spraying techniques. In low pressure plasma spray, powder particles of the coating alloy are heated and propelled towards a substrate inside a vacuum chamber which maintains the spray environment at some low pressure below 1 atmosphere, typically below 50 torr. Powder particle heat and velocity are achieved using a plasma torch designed or modified for operation under reduced ambient pressure. The high velocity oxygen fuel coating method transfers thermal and kinetic energy to powder particles of the coating alloy using a combustion torch, rather than a plasma. The method typically is performed in a spray environment at local atmospheric pressure, and the torch may be manipulated manually or using automated systems. The component being coated is typically fixtured and attached to a table or drive system.

However, other well known techniques, such as air plasma spray, shrouded arc plasma spray, and entrapment plating, or physical vapor deposition pursuant to U.S. Pat. No. 4,080,486 can be used to deposit the MCrAlY coating on the substrate.

The aluminide diffusion overcoating 12 is formed in-situ on the first coating 10 by chemcial vapor deposition (CVD) using a low acitvity aluminum coating gas and substrate coating temperature of at least about 1832 degrees F. (1000 degrees C.) in accordance with allowed copending application Ser. No. 08/330,694 filed Oct. 28, 1994, now U.S. Pat. No. 5,658,614, the teachings of which are incorporated herein by reference. The aluminide diffusion overcoating 12 includes an outwardly grown, outer single phase additive layer 12a and inner diffusion zone 12b proximate the MCrAlY coating 10, leaving some of the MCrAlY coating intact on the substrate S. The outwardly grown additive layer 12a comprises MAl or (M,Pt)Al single phase, where M is selected from the Co, Ni and/or Fe from the underlying MCrAlY coating and where Pt is present when the MCrAlY coating is Pt plated prior to aluminizing as described below. The aluminide diffusion overcoating 12 typically has a total thickness of 0.5 mils to 4.0 mils including both the outwardly grown additive layer 12a and diffusion zone 12b.

In forming the aluminide diffusion overcoating 12, a high purity, low aluminum activity coating gas is used comprising a mixture of hydrogen and aluminum trichloride gases effective under the substrate coating temperature employed to reduce the concentrations of tramp impurites such as S and P and others in the aluminized MCrAlY region of the coating system, particularly the outwardly grown, outer additive layer.

The low activity coating gas is generated by passing high purity hydrogen chloride and hydrogen carrier gases over a high purity source comprising aluminum at a relatively low temperature, such as an aluminum bed at a temperature not exceeding 600 degrees F. Preferably, the high purity aluminum source (at least 99.999 weight % Al) comprises aluminum granny P pellets employed in the external coating gas generator. High purity hydrogen typically comprises less than 30 ppb (parts per billion by volume) impurities and high purity hydrogen chloride typically comprises less than 25 ppm (parts per million by volume) impurities.

The purification effects of the aforementioned CVD aluminizing conditions on the aluminized region of the MCrAlY coating (i.e. on the aluminide overcoating 12) were demonstrated in a series of coating experiments using coating specimens having dimensions of 12 mm by 25 mm by 2 mm thickness cut from a monolithic deposit of CoNiCrAlY alloy applied by high velocity oxy-fuel spraying onto a nickel based superalloy substrate using Hobat-Taffa Model JP-5000 HVOF equipment. The deposition parameters were 5 gallons per hour kerosene and 1600 scfh (standard cubic feet per hour) oxygen at an alloy powder flow rate (particle size −270 mesh) of 16 pounds per hour in ambient atmosphere. The deposit of CoNiCrAlY alloy had a composition, in weight %, of 29.5% Ni, 23.6% Cr, 11.7% Al, 0.7% Y, and balance Co. The CoNiCrAlY tab specimens were CVD aluminized and tested without being applied to a substrate since substrate effects on the aluminide diffusion layer 12 were deemed minimal. The test results from these CoNiCrAlY tab specimens are representative of a variety of MCrAlY type coating alloys in commerical use.

The CoNiCrAlY tab specimens were divided into five groups of specimens (5 specimens per group) with one group being reserved as baseline specimens for pre-aluminizing composition analysis. Two groups of tab specimens were subjected to high activity pack cementation aluminizing, one of the groups being aluminized without an activator (designated hereafter as MDC-15 aluminized specimens) and the other group being aluminized with a halide salt activator (designated herafter as MDC-51 specimens).

The two groups of MCrAlY tab specimens were aluminized by pack cementation (MDC-15 and MDC-51 tab specimens) to produce inwardly grown aluminide coatings. The unactivated MDC-15 pack comprised 33% weight % Al alloy powder and the balance alumina. The tab specimens were placed in the powder pack and heated at 1800 degrees F. (982 degrees C.) for 3 hours in a hydrogen atmosphere for aluminizing. The MDC-51 pack involved an ammonium chloride ($NH_4Cl$) activated powder pack comprising 0.03% weight % ammonium chloride, 67 weight % Al alloy powder, and the balance aluminum oxide. The aluminizing cycle of the tab specimens in the powder pack involved 19 hours at 1900 degrees F. (1038 degrees C.) in an argon atmosphere. The MDC-51 pack cementation aluminized CoNiCrAlY tab specimens were representative of the MCrAlY coating systen described in U.S. Pat. No. 4,080,486.

Two other groups of the CoNiCrAlY tab specimens were CVD aluminized using a low activity aluminum trichloride process described above and in the aforementioned copending application Ser. No. 08/330,694 filed Oct. 28, 1994, now U.S. Pat. No. 5,658,614, incorporated herein by reference, to produce the aluminide diffusion overcoating 12.

In particular, one group of tab specimens designated MDC-210 were CVD aluninized at a substrate temperature of 1080 degrees C. using a coating gas mixture comprising 9 volume % aluminum trichloride and 91 volume % hydrogen at a flow rate of 300 scfh and total pressure of 500 Torr. The coating mixture was generated by passing high purity hydrogen (e.g. less than 30 parts per billion impurities) and high purity hydrogen chloride (e.g. less than 25 parts per million impurities) in mixture of hydrogen/13 volume % HCl over a 99.999% pure source of aluminum at 290 degrees C. in a generator external of the coating retort. Hydrogen chloride which produces a purification of the MCrAlY overlay coating (i.e. reductions in concentration of the tramp element P in this particular CVD coating) was produced by hydrogen reduction of aluminium trichloride on the sample surface. The surface active tramp impurity S was removed from the MCrAlY coating by reaction with the hydrogen carrier gas forming hydrogen sulfide gas.

Another group of tab specimens was first electroplated using a used potassium hydroxide based aqueous electroplating solution having KOH in the range of 30–90 grams KOH per liter and 10 grams of Pt per liter at a current density of 0.015 Ampere/cm$^2$ to deposit 9–11 milligrams Pt/cm$^2$ on the tab specimens. This electroplating solution is described in detail in allowed copending application Ser. No. 08/685,379 filed Jul. 23, 1996, now Pat. No. 5,788,826, and results in reduced concentration of S and P in the electroplated Pt layer as well as introduction of K (or other alkali or alklaine earth element from the hydroxide in solution) into the Pt layer as described in aforementioned copending application Ser. No. 08/685,379, the teachings of which are incorporated herein by reference.

The Pt electroplated group of tab specimens designated MDC-150L were CVD aluninized, without prediffusion of the Pt layer into the MCrAlY coating, at a substrate temperature of 1080 degrees C. using a coating gas mixture comprising 9 volume % aluminum trichloride and 91 volume % hydrogen at a flow rate of 300 scfh and total pressure of 500 Torr. The coating mixture was generated by passing high purity hydrogen (e.g. less than 30 parts per billion impurities) and high purity hydrogen chloride (e.g. less than 25 parts per million impurities) in mixture of hydrogen/13 volume % HCl over a 99.999% pure source of aluminum at 290 degrees C.

The as-deposited baseline tab specimens and alumnized tab specimens were analyzed for major elements using electron microprobe, for trace phosphorous impurities by glow discharge mass spectroscopy (GDMS) through the overcoating to MCrAlY coating (average of measured P levels), and for trace sulfur impurities using a LECO CS444LS analyzer. Sulfur analysis is a bulk measurement including the aluminide coating and MCrAlY coating.

The electron microprobe analysis of the as-deposited CoNiCrAlY tab specimens yielded the alloy composition set forth above; namely, a CoNiCrAlY composition, in weight %, of 29.5% Ni, 23.6% Cr, 11.7% Al, 0.7% Y, and balance Co.

The results of the GDMS and LECO analyses of the tab specimens are set forth in the Table I below where CoNiCrAlY HVOF represents the as-deposited tab specimens without aluminizing.

TABLE I

CHEMICAL ANALYSIS OF CoNiCrAlY TABS

GLOW DISCHARGE MASS SPECTROSCOPY

| ELEMENT | CoNiCrAlY HVOF | Halide Salt Activated HIGH ACTIVITY PACK (MDC-51) | LOW ACTIVITY CVD (MDC-210/ MDC-150L) |
|---|---|---|---|
| P | 10 ppmw | 20 ppmw | 5 ppmw |

LECO LOW SULFUR

| ELEMENT | CoNiCrAlY HVOF | Unactivated HIGH ACTIVITY PACK (MDC-15) | LOW ACTIVITY CVD (MDC-210/ MDC-150L) |
|---|---|---|---|
| S | 4 ppmw | 5 ppmw | 2 ppmw |

The data of the Table I illustrate the purification effects of the CVD low activity aluminizing of the MDC-150L and MDC-210 CoNiCrAlY tab specimens in that S and P concentrations are reduced by at least about 50% in these specimens as compared to the S and P present in the as-deposited CoNiCrAlY HVOF tab specimens without aluminizing.

In contrast, the S concentration of the inwardly grown aluminide diffusion coatings of the high activity pack cementation aluminized MDC-15 tab specimens was increased, while the P concentration of the high activity pack cementation aluminized MDC-51 tab specimens was increased as compared to the as-deposited CoNiCrAlY HVOF tab specimens without aluminizing. As mentioned, the MDC-51 pack cementation aluminized CoNiCrAlY tab specimens were representative of the aluminized MCrAlY coating system described in U.S. Pat. No. 4,080,486.

Cyclic oxidation testing of tab specimens MDC-15, MDC-51, MDC-150L, and MDC-210 was conducted using a one hour cycle that consisted of 50 minutes at a temperature of 1373K (2012 degrees F.) and 10 minutes rapid air cooling. Four specimens were used for each of these type of coating specimens and the results averaged. The aluminide diffusion coating thickness was 2.85 mils for the MDC-15 specimens, 2.7 mils for the MDC-51 specimens, 1.5 mils for the MDC-150L specimens, and 1.1 mils for the MDC-210 specimens. The cyclic oxidation specimens were weighed prior to testing and after each fifty cycles of testing until a zero cross-over (failure) occurred (failure occurred only for MDC-15, MDC-51 and MDC-210 specimens). Table II below sets forth the oxidation test results with the second column being normalized to account for the different aluminide diffusion coating thicknesses involved. Weight change ($\Delta M/A$ in milligrams/centimeter squared) data is plotted in FIG. 2.

TABLE II

1373K CYCLIC OXIDATION
NORMALIZED AND RELATIVE OXIDATION LIFE

|  | CYCLES TO FAILURE | NORMALIZED LIFE cycles/mil | RELATIVE LIFE |
|---|---|---|---|
| MDC-15 | 162 | 57 | 1 |
| MDC-51 | 237 | 88 | 1.54 |
| MDC-210 | 1425 | 1295 | 22.7 |
| MDC-150L** | >1800 | >1200** | <21** |

ON-GOING TESTS

Figure 2:
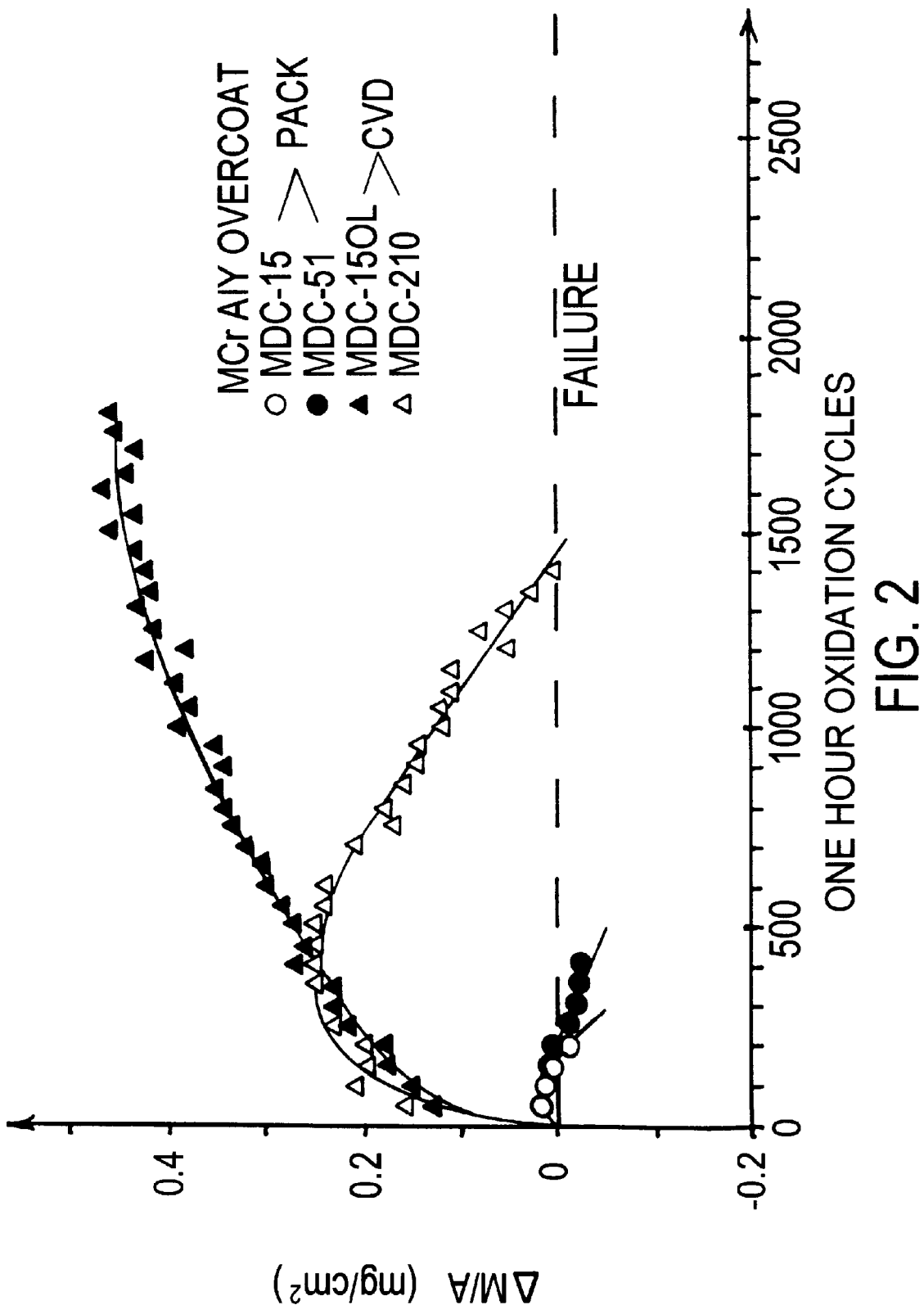
FIG. 2 is a graph depicting comparative cyclic oxidation resistance at 2012 degrees F. (1373K) of MDC-210 and MDC-150L coating systems in accordance with the present invention compared with other coating systems designated MDC-15 and MDC-51 outside the invention.

As shown in Table II and illustrated in FIG. 2, the MDC-150L (Pt electroplated) specimens and MDC-210 (no Pt electroplate) specimens CVD low activity aluminized pursuant to the invention exhibited significantly greater oxidation resistance than the inwardly grown specimens MDC-15 and MDC-51 aluminized by high activity pack cementation. Note that the weight change data for the MDC-150L and MDC-210 specimens indicates no coating failure at the times the MDC-15 and MDC-51 specimens reached zero cross-over (failure). The MDC-210 CVD over-coated specimens reached failure after 1425 oxidation cycles, which indicates a life improvement of greater than 22 times (see Table II). Based upon the available data, the MDC-150L CVD over-coated specimens will exhibit the best oxidation resistance of any coating system tested. In particular, the MDC-150L specimens still had not failed and were undergoing further on-going test cycles at the time the MDC-210 speicmens exhibited zero cross-over (failure).

Although the MDC-150L and MDC-210 specimens exhibited similar outwardly grown aluminide diffusion over-coated structures with the similar reductions in S and P concentrations and similar aluminum concentrations in the coatings, the MDC-150L specimens exhibited better oxidation resistance than the MDC-210 specimens as a result of the presence of Pt and K in the aluminide diffusion over-coating of MDC-150L specimens.

Although the invention has been shown and described with respect to certain embodiments thereof, it should be understood by those skilled in the art that other various changes, modifications and omissions in the form and detail thereof may be made therein without departing from the spirit and scope of the invention.

What is claimed is:

1. Coated gas turbine engine component, comprising a first coating on said component and consisting essentially of chromium, aluminum, an element selected from the group consisting of yttrium, rare earth element and a reactive element, and an element selected from the group consisting of nickel, cobalt and iron, and a chemical vapor deposition outwardly grown aluminide diffusion overcoating on said first coating.

2. The component of claim 1 wherein said aluminide diffusion overcoating is formed under chemical vapor deposition conditions to reduce concentration of a tramp impurity in said overcoating as compared to that in said first coating.

3. The component of claim 2 wherein said aluminide diffusion overcoating has a reduced concentration of at least one of S and P as compared to that in said first coating.

4. The component of claim 3 wherein said aluminide diffusion overcoating has a concentration of sulfur therein that is at least 50% less than the sulfur concentration of the first coating.

5. The component of claim 3 wherein said aluminide diffusion overcoating has a concentration of phosphorous therein that is at least 50% less than the phosphorous concentration of the first coating.

6. The component of claim 3 wherein said aluminide diffusion overcoating includes a sulfur concentration of 20 ppm by weight or less.

7. The component of claim 2 wherein said aluminide diffusion overcoating includes a phosphorus concentration of 20 ppm by weight or less.

8. The component of claim 1 wherein said aluminide diffusion overcoating includes platinum therein.

9. The component of claim 1 wherein said aluminide diffusion overcoating has a thickness of about 0.0005 inch to about 0.004 inch.

10. The component of claim 1 which includes said first coating and said aluminide diffusion overcoating on an exterior surface thereof.

11. The component of claim 10 which includes an aluminide diffusion coating on an interior surface thereof.

12. The component of claim 1 wherein said aluminide diffusion overcoating includes an alkali element or alkaline earth element therein.

13. The component of claim 1 wherein said reactive element is selected from the group consisting of Hf, Zr, and Si.

14. A method of coating a substrate comprising, providing a first coating on said substrate, said first coating consisting essentially of chromium, aluminum, an element selected from the group consisting of yttrium, rare earth element and a reactive element, and an element selected from the group consisting of nickel, cobalt and iron, and aluminizing the first coating under chemical vapor deposition conditions to form an outwardly grown aluminide diffusion overcoating on said first coating.

15. The method of claim 14 wherein said chemical vapor deposition conditions are effective to reduce concentration of a tramp impurity in said overcoating as compared to that in said first coating.

16. The method of claim 15 including reducing the concentration of at least one of S and P as compared to that in said first coating.

17. The method of claim 14 wherein said chemical vapor deposition occurs at a substrate coating temperature of at least about 1000 degrees C. and using high purity coating gas formed by passing high purity hydrogen and hydrogen chloride gases over a high purity source of aluminum.

18. The method of claim 14 wherein the first coating is coated with platinum prior to aluminizing without a prediffusion of platinum layer into the first coating.

19. The method of claim 14 wherein the platinum layer is plated onto the substrate from a hydroxide aqueous plating solution including at least one of alkali hydroxide and alkaline earth hydroxide in a manner to incorporate an element selected from the group consisting of an alkali element and alkaline earth element in the platinum layer.

20. The method of claim 14 wherein an exterior surface of the substrate is coated with said first coating that is aluminized.

21. The method of claim 20 wherein an interior surface of the substrate is concurrently aluminized under said conditions.

22. Coated gas turbine engine component, comprising a first coating on said component and consisting essentially of chromium, aluminum, an element selected from the group consisting yttrium, rare earth element, and a reactive element, and an element selected from the group consisting of nickel, cobalt, and iron, and a chemical vapor deposition outwardly grown aluminide diffusion overcoating including an element selected from the group consisting of an alkali element and alkaline earth element.

23. Coated gas turbine engine component, comprising a first coating on said component and consisting essentially of chromium, aluminum, an element selected from the group consisting of yttrium, rare earth element, and a reactive element, and an element selected from the group consisting of nickel, cobalt, and iron, and a chemical vapor deposition outwardly grown aluminide diffusion overcoating on said first coating, said aluminide diffusion overcoating having an inner diffusion zone and outer single phase aluminide layer formed by outward growth of said overcoating.

24. The component of claim 23 wherein said outer layer further includes platinum.

25. Coated gas turbine engine component, comprising a first coating on said component and comprising MCrAlY where M is selected from the group consisting of nickel, cobalt, and iron, and a chemical vapor deposition outwardly grown aluminide diffusion overcoating on said first coating, said aluminide diffusion overcoating having an inner diffusion zone and outer single phase aluminide layer formed by outward growth of said overcoating.

26. Coated gas turbine engine component, comprising a first coating on said component and comprising MCrAlY where M is selected from the group consisting of nickel, cobalt, and iron, and a chemical vapor deposition outwardly grown aluminide diffusion overcoating on said first coating, said aluminide diffusion overcoating having an inner diffusion zone and outer single phase platinum-bearing aluminide layer formed by outward growth of said overcoating.

27. The method of claim 14 wherein the chemical vapor deposition conditions are effective to form said diffusion aluminide overcoating by outward growth to have an inner diffusion zone and outer single phase aluminide layer.

28. The method of claim 27 including providing a layer comprising platinum on said first coating and then chemical vapor deposition forming said diffusion aluminide overcoating by outward growth to have an inner diffusion zone and outer single phase platinum-bear luminide layer.

* * * * *

UNITED STATES PATENT AND TRADEMARK OFFICE
CERTIFICATE OF CORRECTION

PATENT NO  :  6 129 991

DATED      :  October 10, 2000

INVENTOR(S):  Bruce M. WARNES, et al.

It is certified that error appears in the above-identified patent and that said Letters Patent is hereby corrected as shown below:

Column 8, line 65; replace "luminide" with ---aluminide---.

Signed and Sealed this

Fifteenth Day of May, 2001

Attest:

NICHOLAS P. GODICI

Attesting Officer

Acting Director of the United States Patent and Trademark Office